(12) United States Patent
Xu et al.

(10) Patent No.: US 11,422,199 B1
(45) Date of Patent: Aug. 23, 2022

(54) STATE OF HEALTH EVALUATION OF RETIRED LITHIUM-ION BATTERIES AND BATTERY MODULES

(71) Applicant: Hong Kong Applied Science and Technology Research Institute Company, Limited, Hong Kong (HK)

(72) Inventors: Minjie Xu, Hong Kong (HK); Yaofeng Sun, Hong Kong (HK)

(73) Assignee: Hong Kong Applied Science and Technology Research Institute Company Limited, Hong Kong (HK)

( * ) Notice: Subject to any disclaimer, the term of this patent is extended or adjusted under 35 U.S.C. 154(b) by 0 days.

(21) Appl. No.: 17/351,207

(22) Filed: Jun. 17, 2021

(51) Int. Cl.
  *G01R 31/392* (2019.01)
  *G01R 31/36* (2020.01)
  *G01R 31/374* (2019.01)
  *H01M 10/613* (2014.01)
  *H02J 7/00* (2006.01)
  (Continued)

(52) U.S. Cl.
  CPC ......... *G01R 31/392* (2019.01); *G01R 31/367* (2019.01); *G01R 31/3648* (2013.01); *G01R 31/374* (2019.01); *H01M 10/54* (2013.01); *H01M 10/613* (2015.04); *H02J 7/005* (2020.01)

(58) Field of Classification Search
  CPC .............. G01R 31/392; G01R 31/3648; G01R 31/367; G01R 31/374; H01M 10/54; H01M 10/613; H02J 7/005
  USPC ....................................................... 320/134
  See application file for complete search history.

(56) References Cited

U.S. PATENT DOCUMENTS

| | | | |
|---|---|---|---|
| 6,691,095 B2* | 2/2004 | Singh ................... | G01R 31/379 706/900 |
| 7,072,871 B1* | 7/2006 | Tinnemeyer ......... | G01R 31/367 706/900 |

(Continued)

FOREIGN PATENT DOCUMENTS

| | | | | |
|---|---|---|---|---|
| CN | 104535934 A | * | 4/2015 | ............. G01R 31/36 |
| CN | 107329094 A | | 11/2017 | |

(Continued)

OTHER PUBLICATIONS

ISR and Written Opinion, PCT/CN2021/101217, dated Mar. 7, 2022.

*Primary Examiner* — M Baye Diao
(74) *Attorney, Agent, or Firm* — gPatent LLC; Stuart T. Auvinen

(57) ABSTRACT

A used battery is discharged for a short time from a first Open Circuit Voltage (OCV1) to a second OCV2 and the discharge current ΔQ measured. OCV1 is input to a calibration curve model to obtain a first modeled State of Charge (SOC1) value, and OCV2 is input to the calibration curve model to obtain a second modeled SOC2 value. The State of Health (SOH) is calculated as $\Delta Q/[Q_{new} \times (SOC1-SOC2)]$, where $Q_{new}$ is the battery capacity when new. The used battery is sorted for reuse or disposal based on the SOH value. The calibration curve model is obtained by Artificial Intelligence (AI) modeling of OCV, SOC datapoints from fully charging and discharging used batteries. Only OCV values within a target region having a low first derivative of SOC as a function of OCV are modeled, and OCV1 and OCV2 are within this target region.

20 Claims, 12 Drawing Sheets

(51) Int. Cl.
*H01M 10/54* (2006.01)
*G01R 31/367* (2019.01)

(56) References Cited

U.S. PATENT DOCUMENTS

| | | | | |
|---|---|---|---|---|
| 7,126,341 | B2 * | 10/2006 | Bertness | H02J 7/008 |
| | | | | 324/426 |
| 7,705,602 | B2 * | 4/2010 | Bertness | G01R 31/385 |
| | | | | 324/426 |
| 8,531,158 | B2 | 9/2013 | Wang et al. | |
| 8,674,654 | B2 * | 3/2014 | Bertness | H02J 7/00047 |
| | | | | 320/155 |
| 9,201,119 | B2 * | 12/2015 | Baruzzi | G01R 31/367 |
| 10,193,366 | B2 * | 1/2019 | Josephs | H02J 7/0048 |
| 10,393,813 | B2 | 8/2019 | Sun et al. | |
| 11,171,498 | B2 * | 11/2021 | Chemali | G06N 3/0445 |
| 11,243,262 | B2 * | 2/2022 | Ukumori | H01M 10/48 |
| 11,293,987 | B2 * | 4/2022 | Lee | G01R 31/392 |
| 2005/0194976 | A1 * | 9/2005 | Yumoto | G01R 31/367 |
| | | | | 324/433 |
| 2006/0284600 | A1 * | 12/2006 | Verbrugge | H01M 10/48 |
| | | | | 320/132 |
| 2007/0159137 | A1 * | 7/2007 | Verbrugge | G01R 31/367 |
| | | | | 320/132 |
| 2007/0194756 | A1 | 8/2007 | Cutrona | |
| 2013/0158916 | A1 * | 6/2013 | Baruzzi | G01R 31/3842 |
| | | | | 702/63 |
| 2015/0153418 | A1 * | 6/2015 | Prenninger | G01R 31/382 |
| | | | | 702/63 |
| 2018/0017628 | A1 * | 1/2018 | Takegami | G01R 31/392 |
| 2019/0379212 | A1 * | 12/2019 | Cho | B60L 53/62 |
| 2021/0167620 | A1 * | 6/2021 | Yazami | H02J 7/005 |
| 2021/0245624 | A1 * | 8/2021 | Haga | B60L 58/16 |
| 2021/0339652 | A1 * | 11/2021 | Heidinger | G01R 19/16542 |
| 2022/0021221 | A1 * | 1/2022 | Tyagi | H02M 1/0043 |

FOREIGN PATENT DOCUMENTS

| | | | | |
|---|---|---|---|---|
| CN | 107785624 | A | | 3/2018 |
| CN | 108445406 | A | | 8/2018 |
| CN | 108845264 | A * | 11/2018 | ......... G01R 31/3648 |
| CN | 109061505 | A | | 12/2018 |
| CN | 109143108 | A | | 1/2019 |
| CN | 110346734 | A * | 10/2019 | .......... G01R 31/367 |
| CN | 110501652 | A | | 11/2019 |
| CN | 111308374 | A | | 6/2020 |
| CN | 111381178 | A | | 7/2020 |
| CN | 112180279 | A * | 1/2021 | .......... G01R 31/392 |
| CN | 110068772 | B * | 7/2021 | .......... G01R 31/367 |
| CN | 113614554 | A * | 11/2021 | |
| EP | 2806482 | B1 * | 6/2017 | .......... B60L 11/1861 |
| FR | 3029315 | A1 * | 6/2016 | .......... G01R 31/367 |

* cited by examiner

STATE OF HEALTH EVALUATION OF RETIRED LITHIUM-ION BATTERIES AND BATTERY MODULES

FIELD OF THE INVENTION

This invention relates to battery screening methods, and more particularly for methods to screen aged or retired batteries for re-use.

BACKGROUND OF THE INVENTION

Electric batteries have been widely deployed to power various systems. Traditionally many battery-powered systems have low power, but more recently demand has been growing for batteries for use in Electric Vehicles (EV's). Each EV requires a large battery pack to provide the significant power required to propel the EV.

More expensive Lithium-ion batteries are often used with EV's. The chemicals used in such advanced batteries pose disposal problems. Toxic chemicals can leak from disposed batteries and contaminate water sources. As EV's grow in popularity, additional burdens will be placed on disposal landfills as EV batteries are retired from service.

Recycling Lithium-ion and other batteries may require acids or furnaces that can cause additional environmental concerns. Low profit margins make battery recycling unattractive.

EV battery packs in particular may be replaced prematurely. The EV manufacturer's recommendations may dictate that repair shops swap out battery packs that fall below a fairly high discharge capacity needed to ensure sporty EV performance. The EV battery packs may be removed before all of the battery cells have worn out. Especially for large battery packs, there may be many cells or groups of cells that still have a significant useful life remaining. These battery cells could be useful for powering other systems that have less stringent power requirements, such as communication and computer backup systems. Rather than dispose of the replaced EV batteries in a landfill or melting them down, re-using EV batteries may extend their useful lifetime by as much as 5 to 7 years, providing a more sustainable and environmentally-friendly approach.

The usability of a used battery can be defined by its State-of-Health (SOH) ratio. The SOH is the ratio of the battery's current energy storage capacity ($Q_{now}$) to that battery's initial or nominal energy storage capacity ($Q_{new}$). Storage capacity is approximated by the battery's discharge capacity.

In contrast, a battery's State of Charge (SOC) is the ratio of the battery's current charge capacity ($Q_{current}$) to the battery's current energy storage capacity ($Q_{now}$).

The SOC is commonly displayed to users as the % battery charge.

$$SOC = \frac{Q_{current}}{Q_{now}}$$

$Q_{current}$ can be measured by coulomb counting or integrating the discharging current when a used battery is tested. $Q_{now}$ can also be measured for a new battery, or the manufacturer's specification can be used.

The battery's health, SOH, can be expressed as a function of $Q_{current}$ and $Q_{new}$ when SOC is known:

$$SOH = \frac{Q_{now}}{Q_{new}} \times 100\% = \frac{Q_{current}}{SOC \times Q_{new}} \times 100$$

FIG. 1 shows a prior-art battery capacity test. Many variations are possible and FIG. 1 is merely for illustration and is not necessarily representative of any particular battery test.

Accurately measuring a battery's full storage capacity can require a lot of time. Rapid charging or discharging can heat the battery and affect measurements. The battery initially may have a residual charge stored that needs to be discharged before capacity measurements.

The battery being tested is initially charged to 3.8 volts by applying a Constant Current (CC) having a value of 1C amps, and then once the voltage target of 3.8 volts is reached, reducing this current to maintain a Constant Voltage (CV) of 3.8 volts, step 202. The current will fall during the CV phase until a low current value is reached, such as 0.01C, or until a time period has elapsed.

The battery is allowed to cool for one hour before the next step. Also, the battery may be allowed to cool for 10 minutes before the initial charging of step 202.

After the 1-hour cooling period, the battery is discharged using a Constant Current (CC) having a fixed current value of 1C. Once the battery's voltage falls from 3.8 volts to 2.8 volts, discharging stops and the battery is allowed to rest and cool for an additional hour, step 204.

The battery is then charged to a higher voltage of 4.25 volts by applying a Constant Current (CC) of 1C, and then when the battery voltage reaches 4.25 volts, Constant Voltage (CV) charging is performed where the current is reduced to maintain a constant battery voltage of 4.25 volts. After the charging current falls below a lower threshold, charging ends and the battery allowed to rest and cool for another hour, step 206.

Finally the battery is slowly discharged using a Constant Current (CC) of only 5% of the earlier discharge current, or 0.05C. This discharge current continues until the battery voltage reaches 2.8 volts, step 208. The battery's discharge capacity is measured by integrating the 0.05C discharge current over the time required to reach the 2.8-volt endpoint. This integrated current can be compared with the specified charge for a similar test on a new battery to calculate the SOH ratio.

The 0.05C low-current in discharge step 208 may require a long time period, such as 20 hours, when the 1C discharge of step 204 exceeds one hour. The total test time may exceed 26 hours, including the hour-long rest periods in steps 202, 204, 206. This lengthy test time is costly and undesirable.

FIGS. 2A-2B are graphs of the Open Current Voltage (OCV) of a used battery as a function of its State of Charge (SOC). In FIG. 2A, the OCV of a battery with no load is relatively linear in region 502, between roughly 10% and 90% SOC. Below 10% charge and above 90% charge the curve is not as linear. FIG. 2A shows a curve for a Nickel Manganese Cobalt (NMC) battery.

FIG. 2B shows a charge curve for a Lithium Iron Phosphate (LFP) battery. OCV is both linear and flat in region 504, between about 10% and 90% charge (SOC). The different chemistry of LFP versus NMC batteries results in different slopes in regions 502, 504, but still provide linear regions in the 10-90% SOC range.

FIG. 3 is a graph showing charging and discharging curves. When a battery is charged, the measured voltage $V_{charge}$ applied to the battery is slightly higher than the OCV.

Similarly, the measured discharge voltage $V_{discharge}$ is slightly lower than the OCV. The difference between $V_{charge}$ and $V_{discharge}$ may be caused by current passing through internal resistances in the battery. For low currents, OCV can be approximated as the average of $V_{charge}$ and $V_{discharge}$, based on the internal resistance (Rint) model:

$$OCV = \frac{(V_{charge} + V_{discharge})}{2}$$

For the Rint model to be valid, the discharge current should be less than 5% of the full current, or 0.05C. Using such a small current requires a long discharge time when the battery is completely discharged from a fully-charged state. The discharge time can be as much as 19 hours to several days. Because the battery needs time to reach chemical equilibrium and to cool, measuring OCV accurately may require long rest periods, even overnight resting. Extra electrical components may need to be added to the battery tester for accurate OCV measurement. Thus, using an OCV test for screening used batteries has drawbacks such as time and expense.

Existing fast screening methods such as Coulomb Counting and Internal Resistance methods thus suffer from long test periods. The goodness of fit may be lower for the Internal Resistance method. Complex setups may be needed with these methods.

What is desired is a screening method for used batteries. It is desired to measure the discharge capacity of used batteries over a small voltage range to speed testing. It is desired to more rapidly determine battery health using just 2 voltage measurements, along with coulomb counting between the 2 voltages. A pre-calibrated method using Artificial Intelligence (AI) is desired to more rapidly screen used batteries.

DETAILED DESCRIPTION

The present invention relates to an improvement in battery screening. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 3:
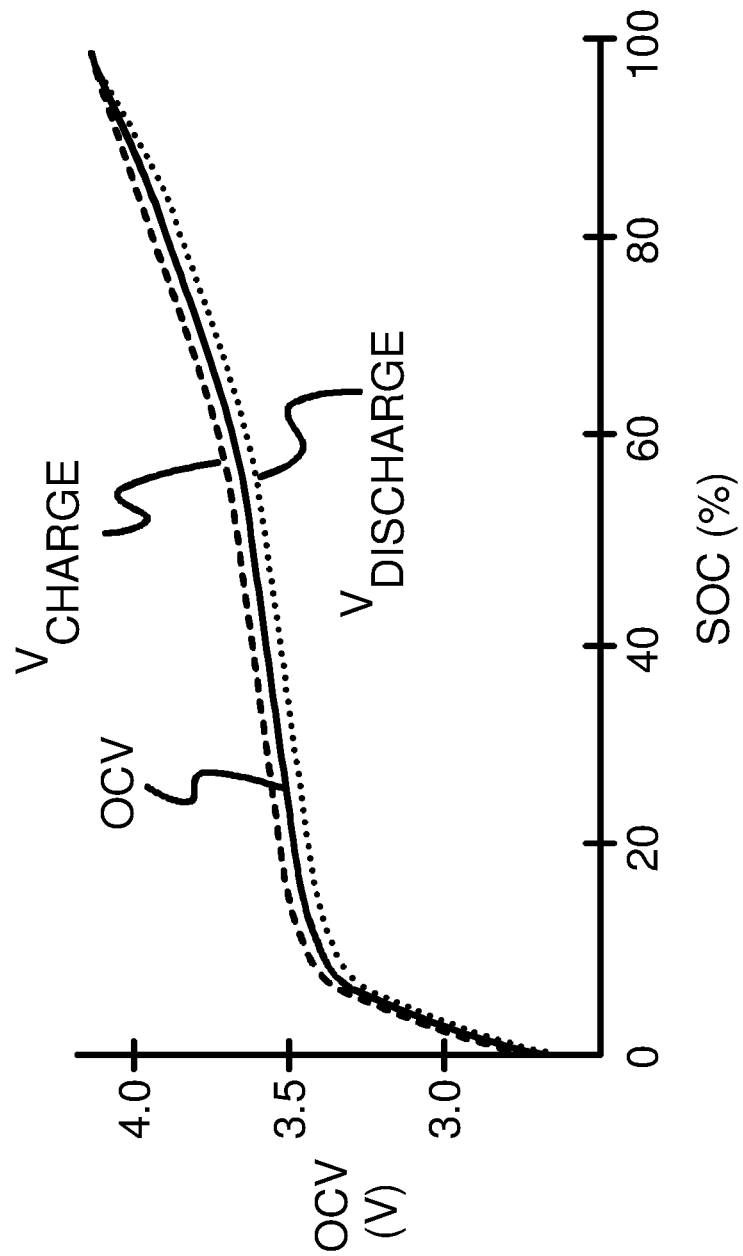
FIG. 3 is a graph showing charging and discharging curves.
Figure 4:
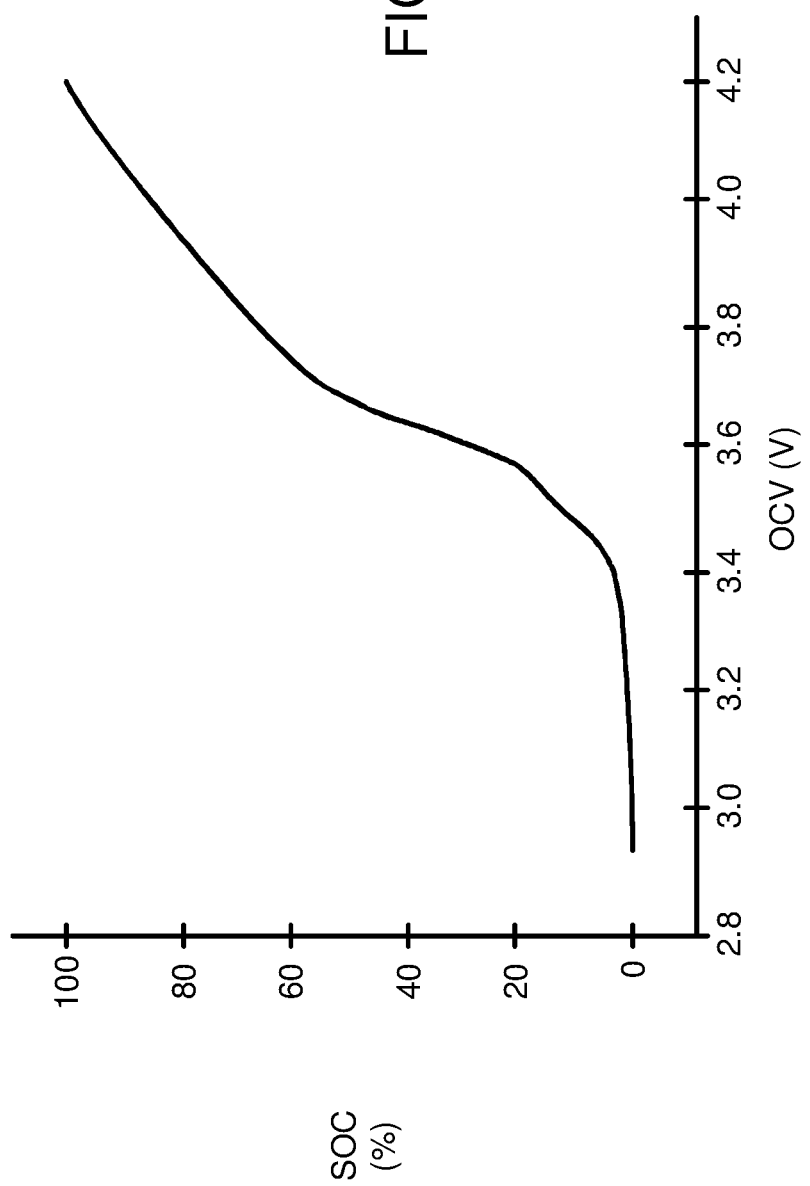
FIG. 4 shows a battery modelling curve.

FIG. 4 shows a battery modelling curve. The inventors take the OCV-SOC curve of FIG. 3 and flip the x and y axes so that SOC is a function of OCV.

Figure 5:
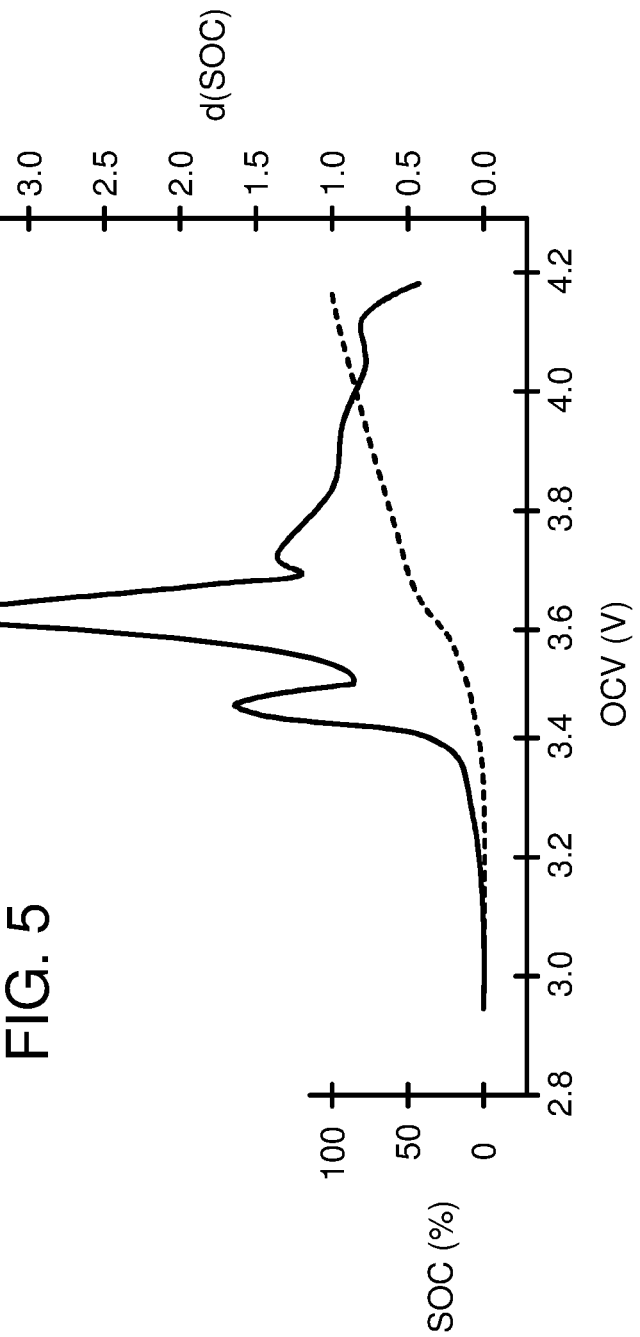
FIG. 5 shows the first derivative of the battery modeling curve.

FIG. 5 shows a derivative of the battery modeling curve. The inventors next take the first derivative of the SOC-OCV battery modeling curve of FIG. 4 (shown as a dashed line in FIG. 5). This first derivative d(SOC) shows spikes where the SOC-OCV curve bends.

Figure 6:
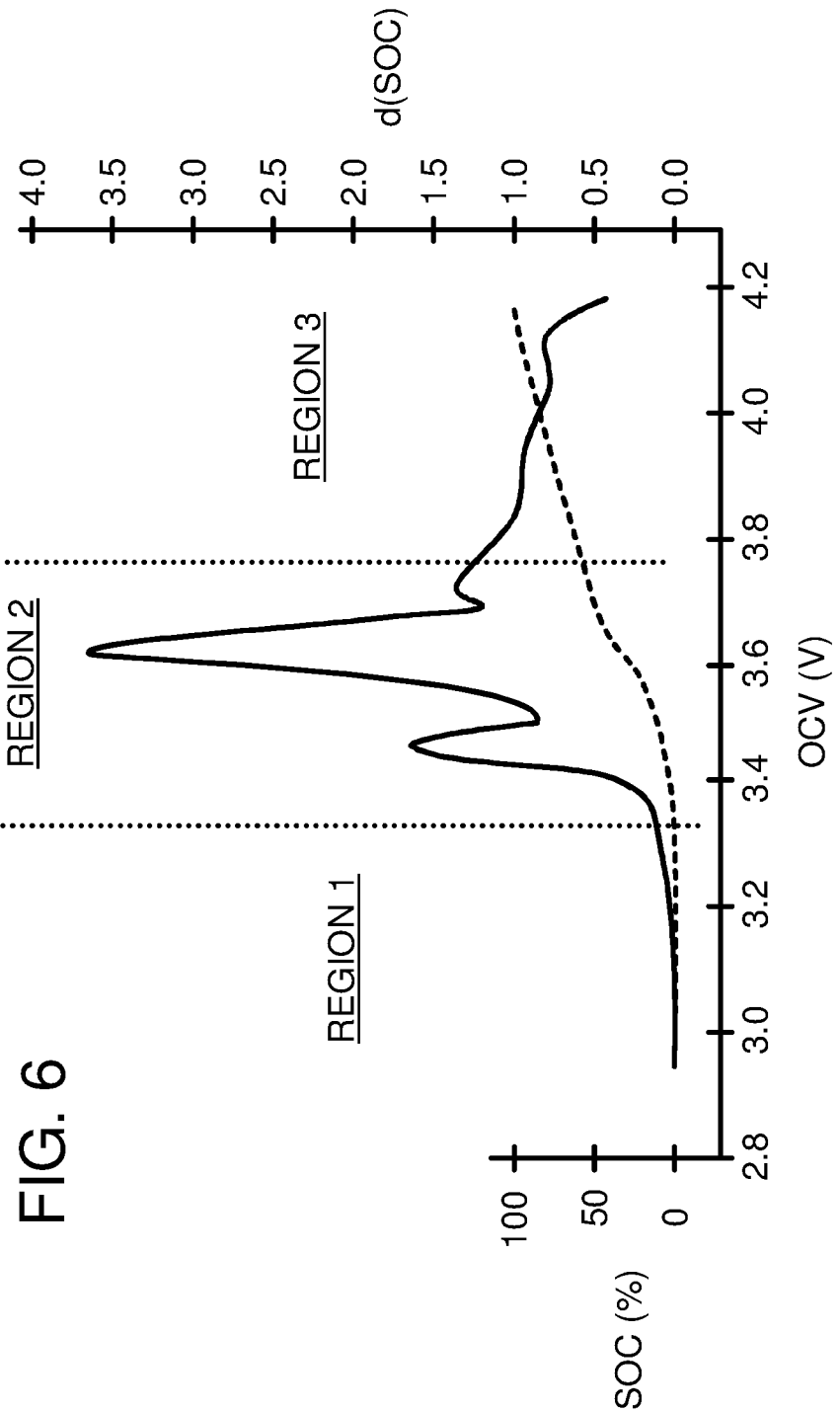
FIG. 6 shows regions of the derivative of the battery modeling curve.

FIG. 6 shows regions of the derivative of the battery modeling curve. The inventors note that the derivative can be divided into three regions. The middle region 2 has the largest spikes of the derivative. Region 3 has decreasing but still higher derivative values than region 1. Region 1 has the smallest derivative values. Region 1 occurs for the smallest OCV values, when the battery has less than 10% charge, or SOC<10%.

Figure 1:
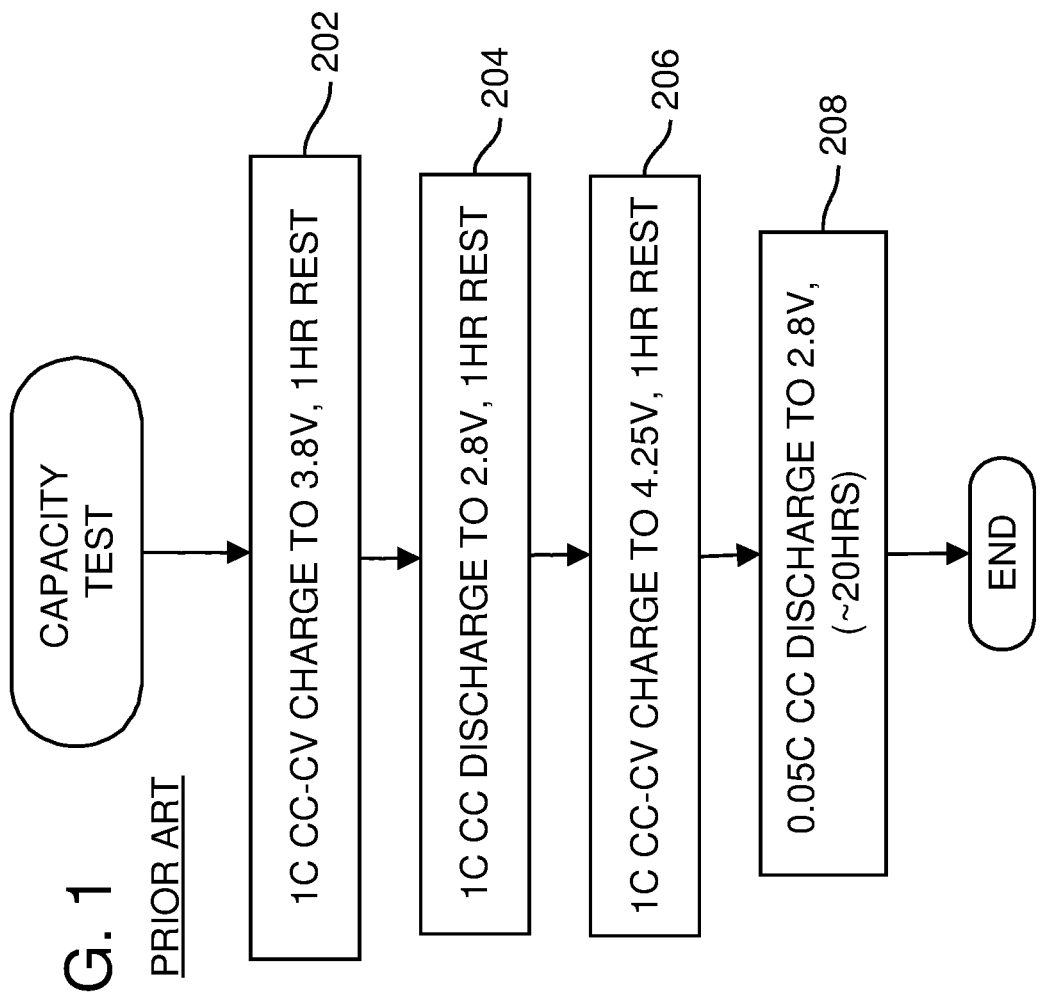
FIG. 1 shows a prior-art battery capacity test.
Figure 2A:
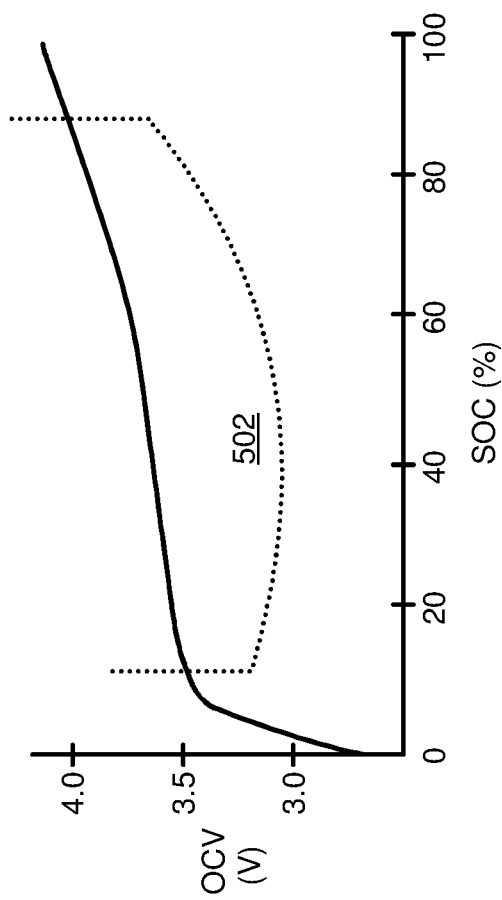
FIGS. 2A-2B are graphs of the Open Current Voltage (OCV) of a used battery as a function of its State of Charge (SOC).
Figure 2B:
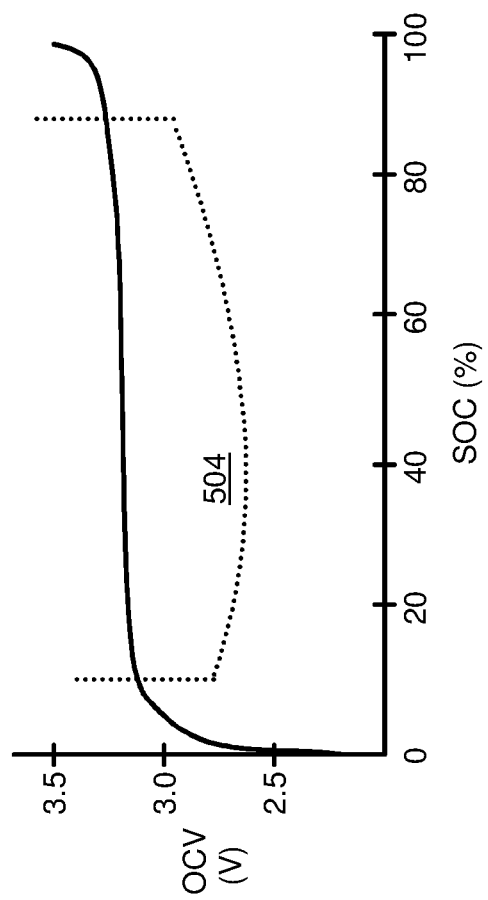

The inventors realize that regions with lower derivative values have less variation and are better suited for modeling. It is surprising that the smallest derivative is region 1, from 0 to 10% SOC, since prior-art OCV testing shows flat regions 502, 504 (FIGS. 2A-2B) that are in the middle region, 10-90% SOC. Yet when SOC is modeled as a function of OCV (FIG. 4), the flat region occurs at SOC<10%, with OCV<3.4 volts.

The inventors use Artificial Intelligence (AI) to model SOC as a function of OCV, and perform this modeling only in region 1, where the derivative is low and the error is also low, such as less than 5%. Region 1 can be selected as having derivative values less than 5%, or d(SOC)<0.5, as an example. Then the inventors perform OCV testing in region 1, using the modeled results for region 1. This greatly improves AI modeling accuracy to model only region 1, and not regions 2 and 3.

Figure 9:
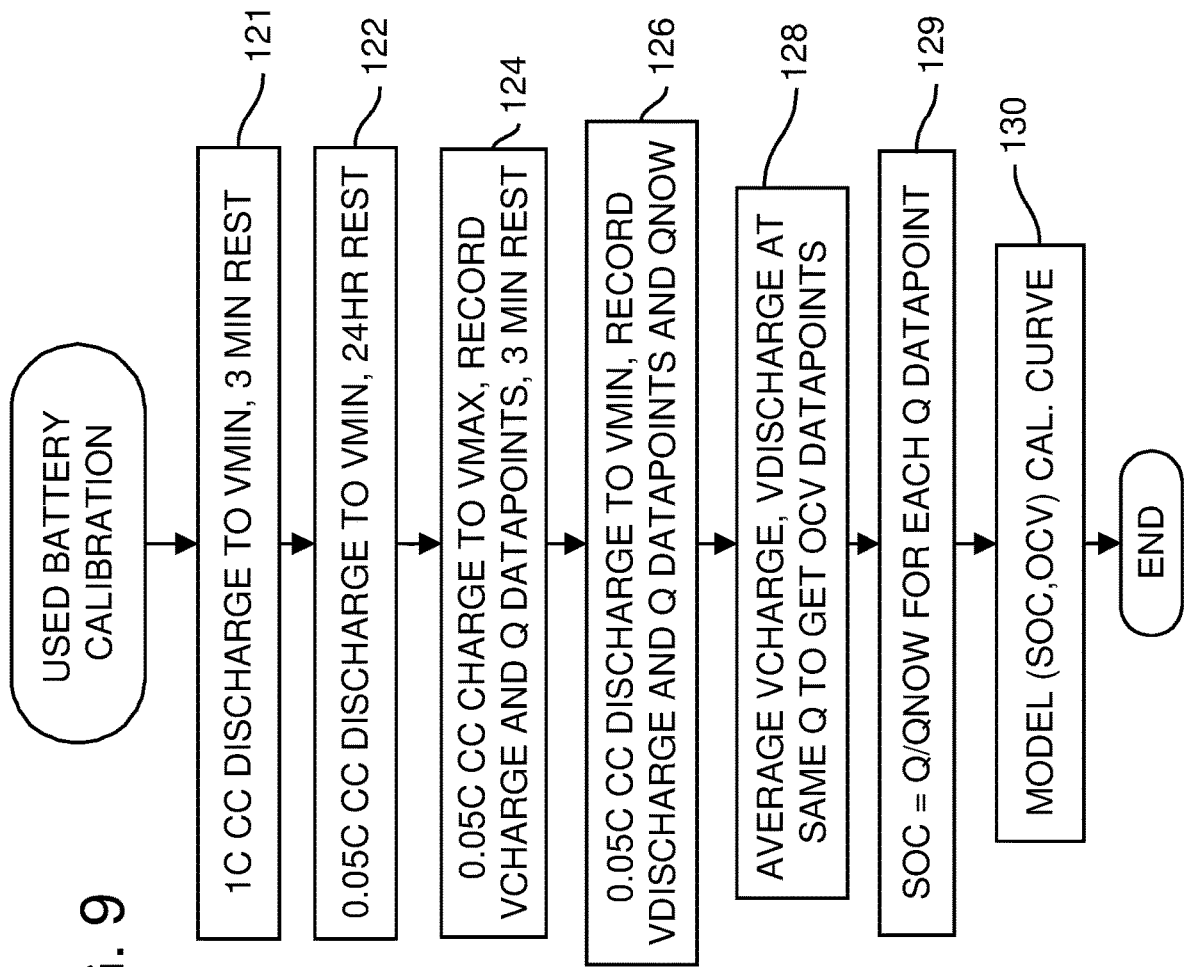
FIG. 9 shows a process to test used batteries to obtain OCV and SOC values to model a calibration curve.

The SOC, OCV datapoints obtained by the calibration process of FIG. 9 may be plotted as points in a graph. A calibration curve is generated as a best-fit function that best fits these data points. The calibration curve model generated by step 130 of FIG. 9 is used in step 112 of FIG. 10B to obtain a modeled SOC values for 2 OCV voltage datapoints. Then SOH is calculated in step 118 of FIG. 10B.

The calibration curve model can be obtained from AI modeling of these (SOC, OCV) datapoints, such as using a least-squares method to find parameters to optimize using a neural network. Other statistical methods could also be used.

Artificial Neural Networks (ANN) may be used to generate a model of SOC as a function of OCV. Artificial Neural Networks are especially useful for processing large amounts of non-linear data in complex ways that are hard to define using traditional computer programs. Instead of being programmed with instructions, training data is input to a neural network and compared to the expected output, then adjustments are made within the neural network and the training data is again processed and outputs compared to generate further adjustments to the neural network. After many such training cycles, the neural network is altered to efficiently process data similar to the training data and expected outputs. Neural networks are an example of machine learning, since the neural network learns how to generate the expected outputs for the training data. Real data similar to the training data can then be input to the neural network to process live data.

Figure 7:
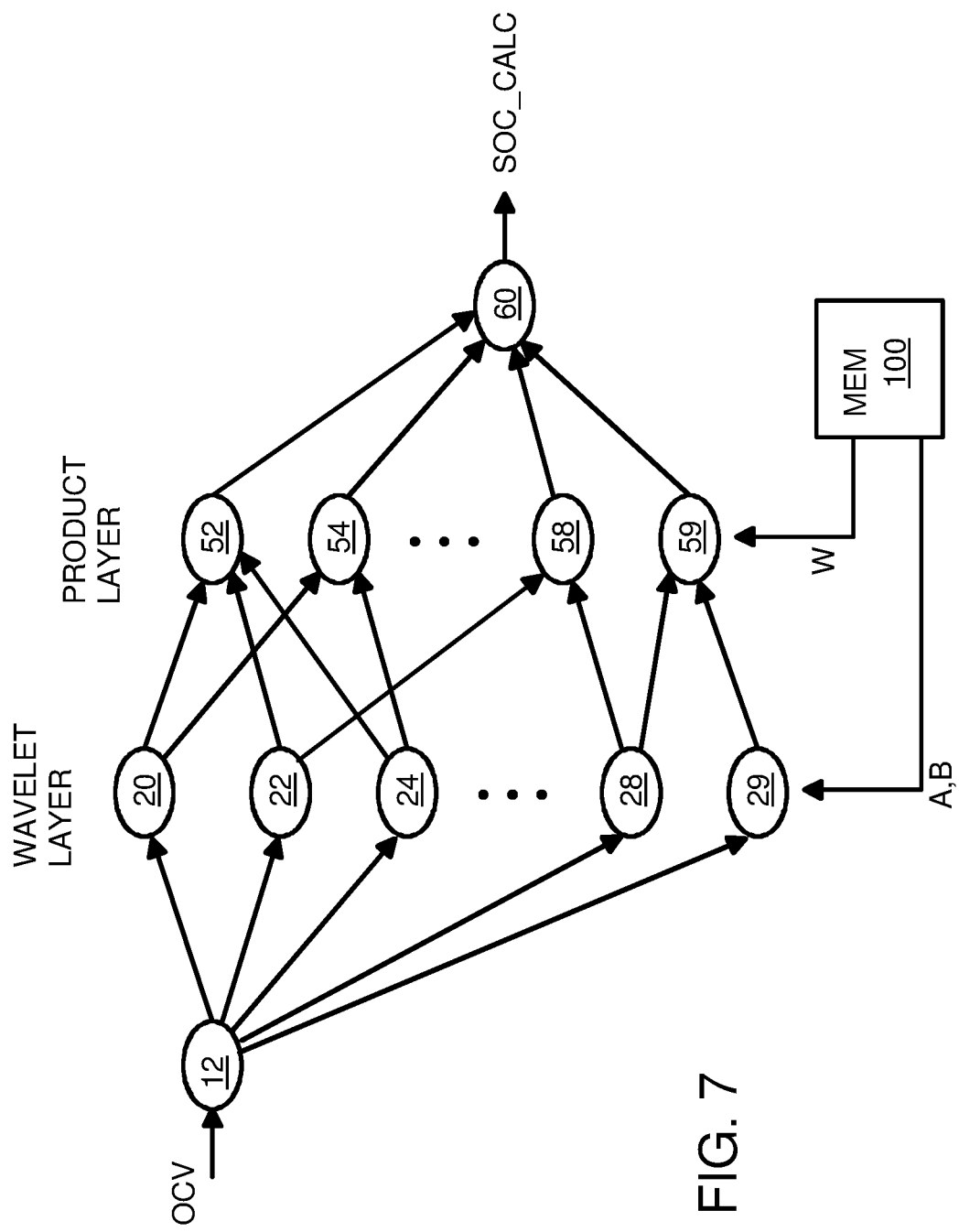
FIG. 7 illustrates a neural network for modeling the calibration curve of SOC as a function of OCV.

FIG. 7 illustrates a neural network for modeling the calibration curve of SOC as a function of OCV. Input node 12 receives input data OCV, while output node 60 outputs the result of the neural network's operations, SOC_CALC, which is the modeled SOC value for the input OCV value. Two layers of operations are performed within this neural network. Nodes 20, 22, 24, . . . 28, 29, each take inputs from input node 12, perform a wavelet function operation, and send an output to nodes in the second layer. Second-layer nodes 52, 54, . . . 58, 59 also receive multiple inputs, combine these inputs to generate an output, such as by generating products, and sends the outputs on to third-level node 60, which similarly combines or sums the inputs to generates an output.

The inputs at each level are typically weighted, so weighted sums (or other weighted operation results) are generated at each node. Each input at a node can be assigned a weight that is multiplied by that input before all the weighted inputs are summed, multiplied together, or otherwise operated upon by the node to generate the node's outputs. These weights are designated $A_{ij}$, $B_{ij}$ to nodes 20, 22, 24, . . . 28, 29 in the wavelet layer, and are designated $W_{13}$ for nodes 52, 54, . . . 58, 59 in the product layer. The values of these $A_{ij}$, $B_{ij}$, $W_{ij}$ weights are adjusted during training. Through trial and error or other training routines or learning algorithms, eventually higher weights can be given for paths that generate the expected outputs, while smaller weights assigned to paths that do not generate the expected outputs. The machine learns which paths generate the expected outputs and assigns high weights to inputs along these paths.

These weights can be stored in weights memory 100, or in another memory. Since neural networks often have many nodes, there may be many weights to store in weights memory 100. Each weight may require multiple binary bits to represent a range of possible values for that weight. Weights often require 8 to 16 bits. Weights memory 100 can be a SRAM, DRAM, flash memory, disk, or various combinations of these or other computer memory devices.

Figure 8:
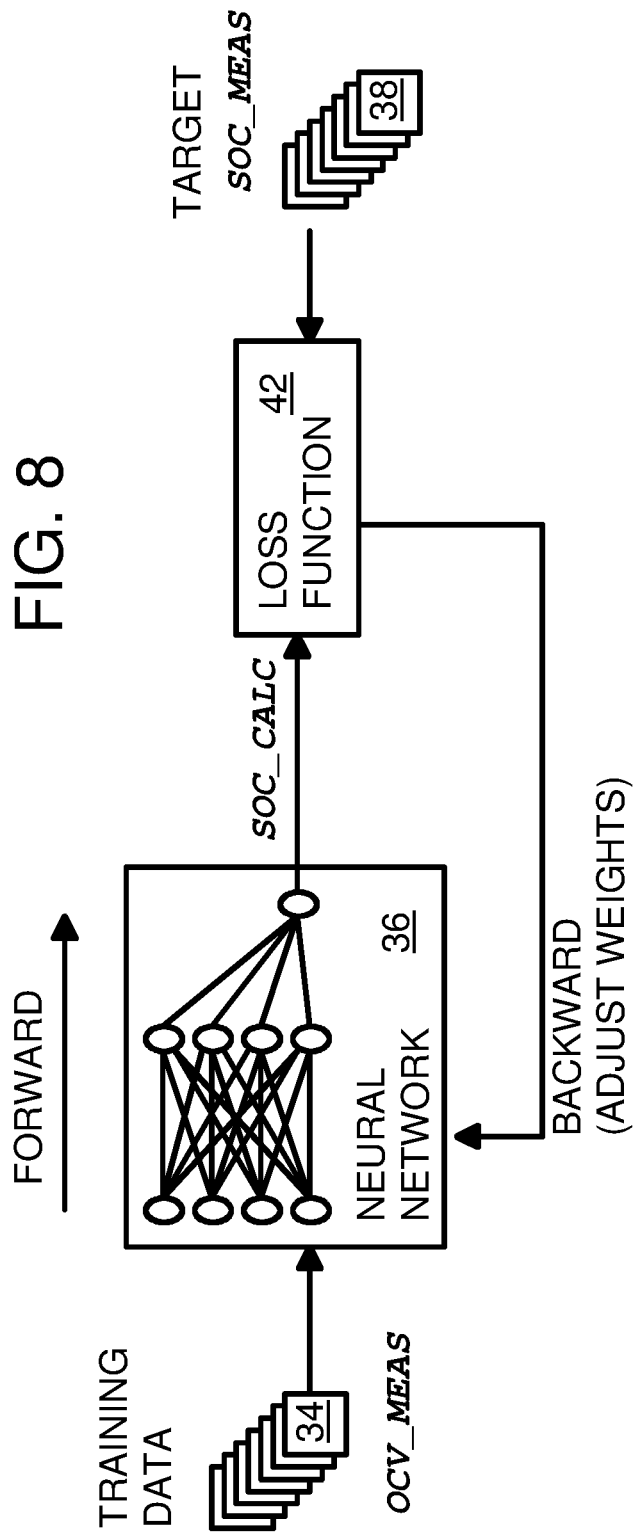
FIG. 8 shows training a neural network using the measured SOC as the target to generate a used-battery calibration model.

FIG. 8 shows training a neural network using the measured SOC as the target to generate a used-battery calibration model. Measurements of aging batteries are made and the measured OCV and SOC data are stored and modeled in step 130 of FIG. 9. The measured OCV data are used as training data 34, OCV_MEAS. The measured SOC data that corresponds to the OCV_MEAS values are recorded as target data 38, SOC_MEAS. Each value of SOC_MEAS corresponds to a value of OCV_MEAS that were measured at the same time in the life of the aging battery tested using the process of FIG. 9.

Neural network 36 receives training data 34 and a current set of weights $A_{ij}$, $B_{ij}$, $W_{ij}$, and operates on training data 34 to generate a result. This generated result is the modeled value of SOC, SOC_CALC. The generated result from neural network 36, SOC_CALC, is compared to target data 38, SOC_MEAS, by loss function 42, which generates a loss value that is a function of how far the generated result is from the target. The loss value generated by loss function 42 is used to adjust the weights applied to neural network 36. Many iterations of weights may be applied by loss function 42 onto training data 34 until a minimum loss value is identified, and the final set of weights used to model the calibration curve.

Rather than generate a single value of SOC_CALC, neural network 36 may have multiple output nodes 60 to generate many SOC_CALC values in parallel from the parallel inputs of OCV_MEAS. Loss function 42 may compare in parallel the many values of SOC_CALC to many values of SOC_MEAS to generate a loss function value.

Figure 10A:
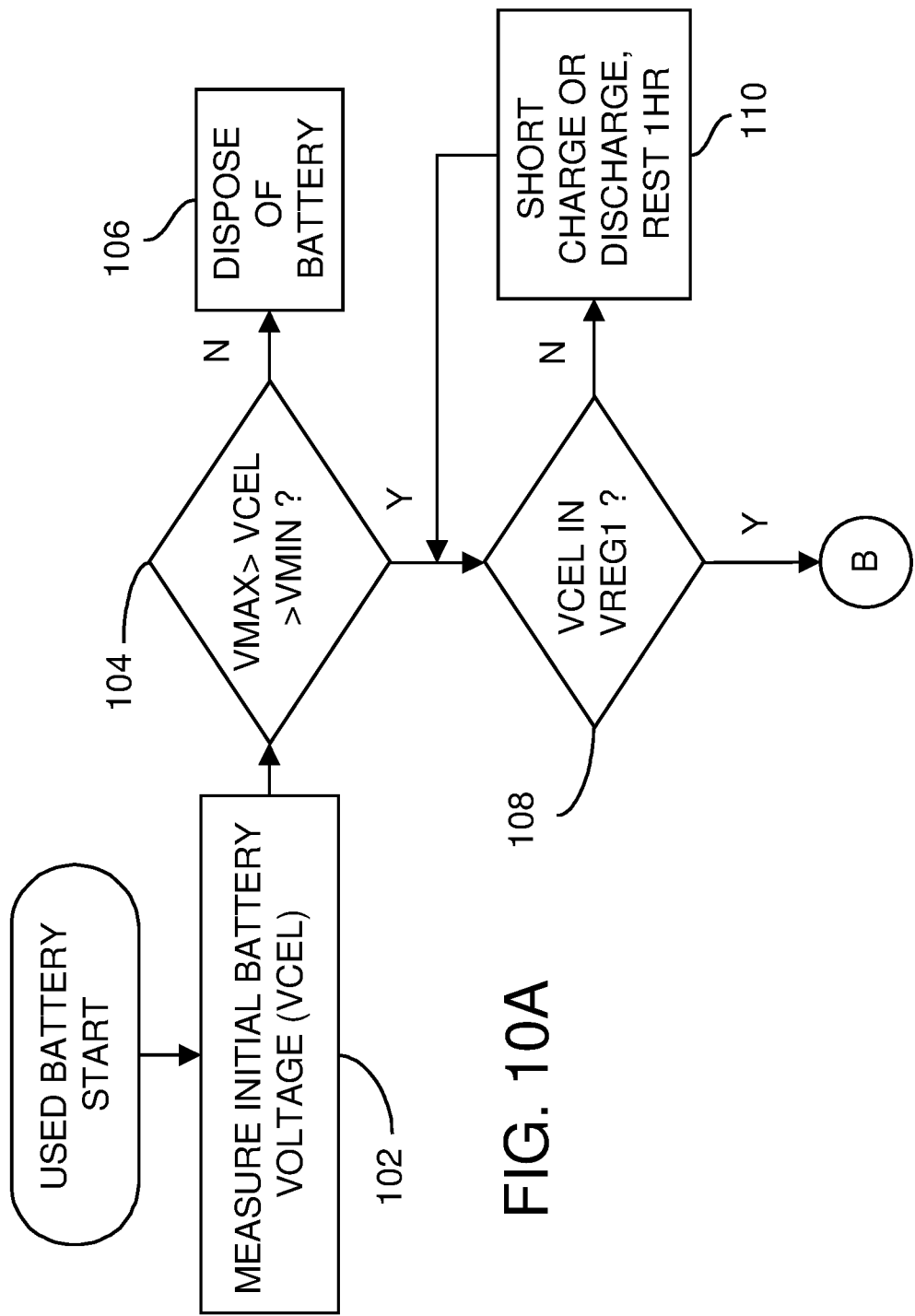
FIGS. 10A-10B is a method to test and sort used batteries based on two (Q, OCV) datapoints measured during a short regio-OCV test.
Figure 10B:
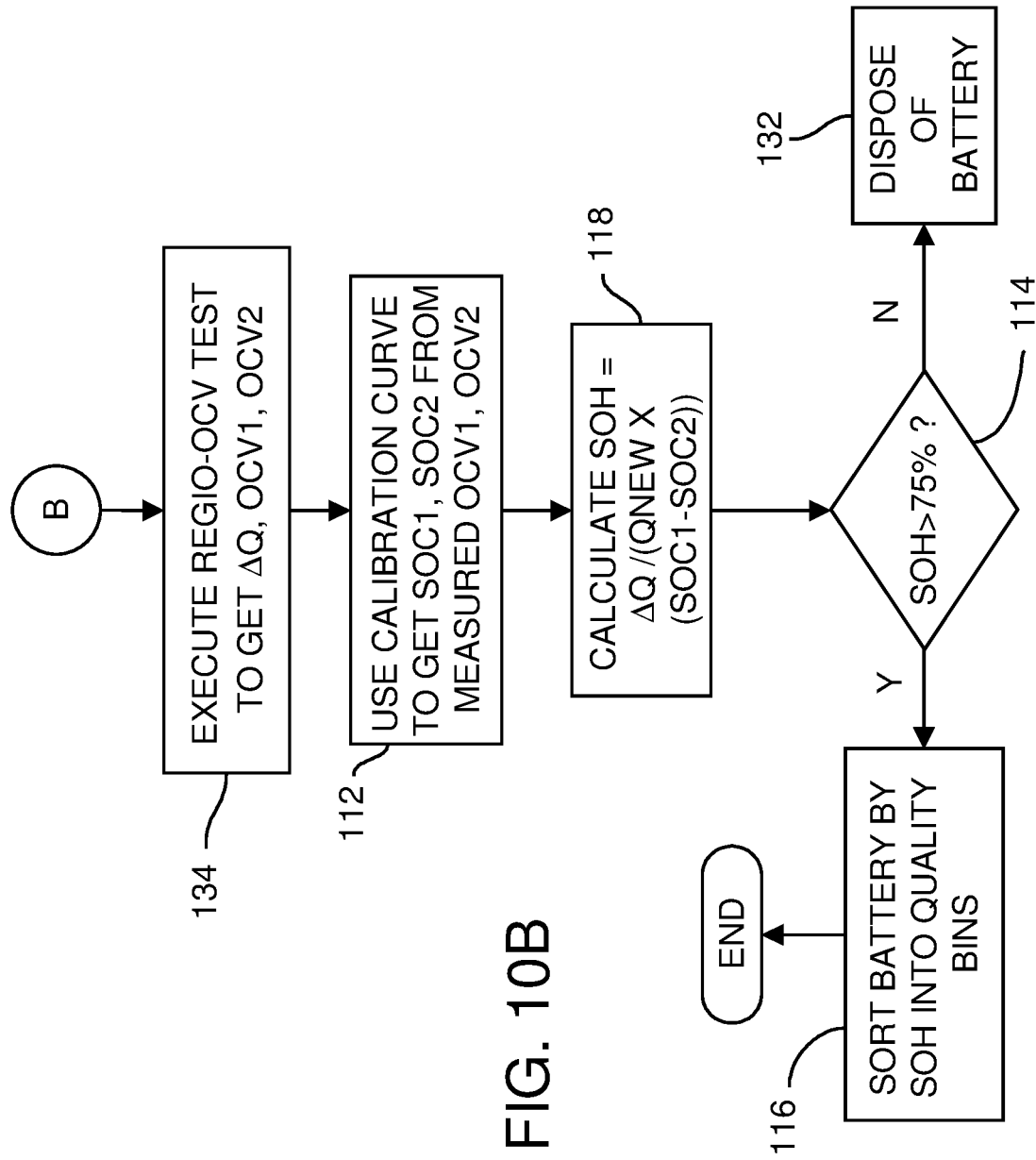
Figure 11:
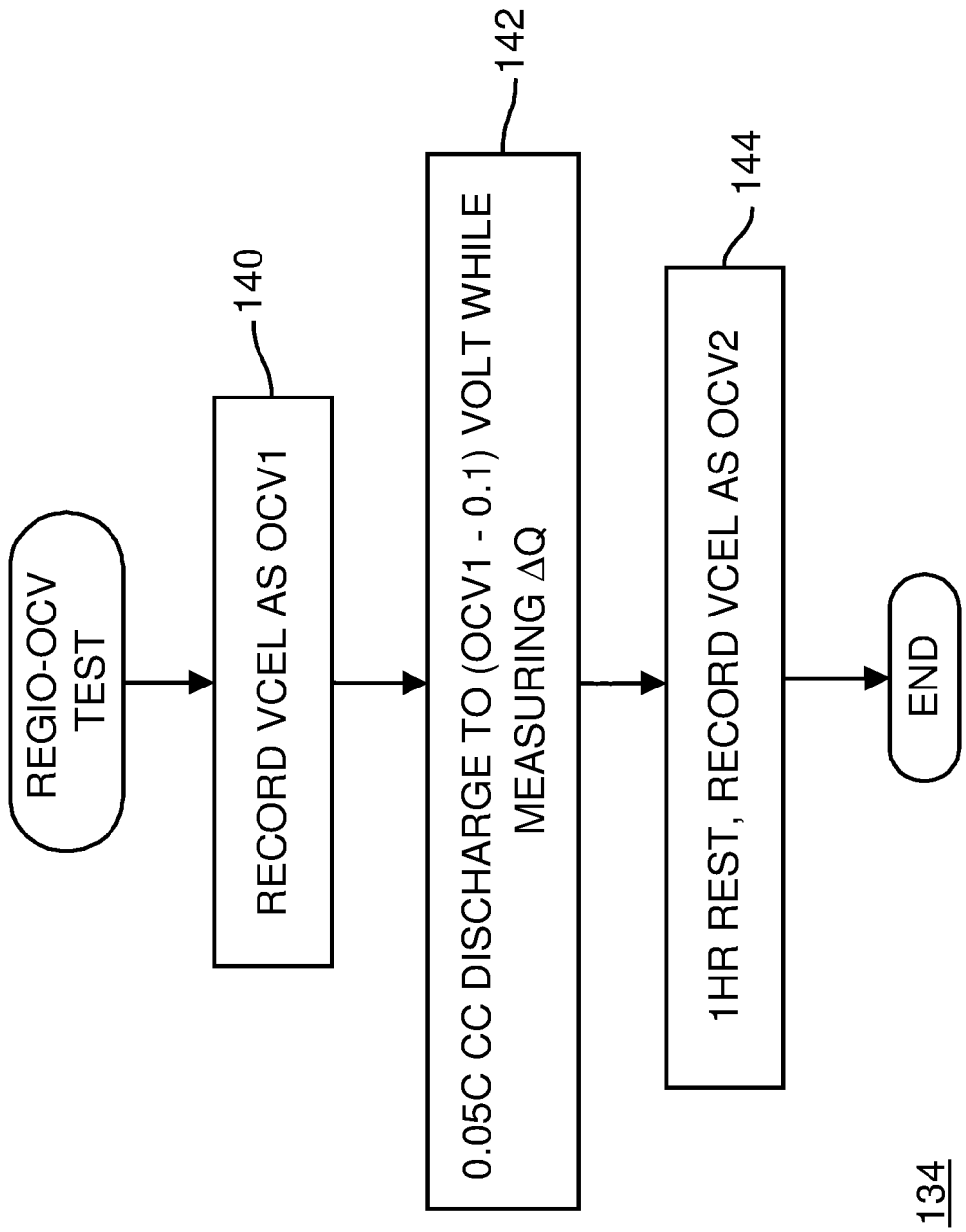
FIG. 11 shows the regio-OCV test in more detail.

FIG. 9 shows a process to test used batteries to obtain OCV and SOC values to model a calibration curve. The process of FIG. 9 can be repeated using several used batteries to obtain a dataset that can be input to a Neural Network (FIGS. 7, 8) to model a calibration curve that later can be used for sorting used batteries (FIGS. 10A-10B, 11).

The used battery to be tested for calibration is initially discharged using a large constant current of 1C until a target minimum voltage Vmin is reached, step 121. After waiting 3 minutes, the battery is further discharged with a constant current of 0.05C until a target minimum voltage Vmin is again reached, step 122. The battery is allowed to cool and rest for 24 hours.

After the rest period, the battery is charged with a Constant Current (CC) of 0.05C until a target maximum voltage Vmax is reached, step 124. The constant current is integrated over time to obtain Q. A battery tester machine may be used to record the battery voltage as $V_{charge}$ and integrated current Q for each time period or time-step. Many datapoints, each having a Q and $V_{charge}$ value, are stored or otherwise recorded.

The battery is discharged using a constant current of 0.05C until Vmin is reached, step 126. The 0.05C constant discharge current is integrated over time to obtain the used battery's present discharge capacity, $Q_{now}$. The battery tester machine may be used to record the battery voltage as $V_{discharge}$ and integrated current Q for each time period or time-step. Many datapoints, each having a Q and $V_{discharge}$ value, are stored or otherwise recorded.

For each of the many values of Q, the $V_{charge}$ value obtained during charging step 124, and the $V_{discharge}$ value obtained during discharging step 126, are averaged, step 128, to obtain an OCV value for that Q value.

The Q values are then converted to SOC values, step 129. Since Q and SOC are linearly related to each other, SOC can be calculated as SOC=$Q/Q_{now}$ for each datapoint. The (Q, $V_{charge}$) datapoints obtained in step 124 and the (Q, $V_{discharge}$) datapoints obtained in step 126 have thus been converted to (SOC, OCV) datapoints.

The stored OCV and SOC datapoints are applied to an AI engine (FIGS. 7, 8) to generate a model of SOC as a function of OCV, the calibration curve, step 130.

FIGS. 10A-10B is a method to test and sort used batteries based on two (Q, OCV) datapoints measured during a short regio-OCV test. The voltage of each used battery is measured as Vcel, step 102. When Vcel is above a maximum voltage Vmax or is below a minimum voltage Vmin, step 104, the battery is disposed of, step 106. Batteries having initial voltage Vcel between Vmin and Vmax, step 104, are processed further.

The battery voltage Vcel is compared to the range of OVC voltages for region 1, step 108. For the battery of FIG. 6, region 1 is for OCV<3.4 volts. When Vcel is more than 3.4 volts, step 108, the battery is discharged for a short period, step 110, and after a rest period the battery voltage Vcel is again compared to the range of region 1 OCV voltages, step 108. The battery is repeatedly discharged and compared until its voltage falls within region 1, step 108.

In FIG. 10B, once the battery voltage is within the target OCV region, a region-OCV or regio-OCV test is performed on the used battery, step 134. The battery tester discharges the battery between two voltages OCV1 and OCV2 while measuring the discharge current ΔQ. OCV1 and OCV2 are close to each other, such as when OCV1=OCV2+0.1 volt, so the charge/discharge current ΔQ and charging time is small. OCV1 can be the most-recent voltage of the battery, Vcel measured in step 108, although the battery tester can measure the battery voltage again. This test is shown in more detail in FIG. 11.

The calibration curve modeled by AI in step 130, FIG. 9, is used. OCV1 is input to the calibration-curve model which outputs SOC1, then OCV2 is input to the calibration curve model to obtain SOC2.

The State of Health (SOH) is calculated, step 118, from SOC1, SOC2, ΔQ, and $Q_{new}$ using the formula:

$$SOH = \frac{\Delta Q}{[Q_{new} \times (SOC1 - SOC2)]}$$

SOC1 and SOC2 were obtained from the AI calibration curve model in step 112, ΔQ was obtained from coulomb counting in step 134, and $Q_{new}$ is the manufacturer's specified full charge capacity of a new battery, or could be measured for a new battery.

The SOH for the battery being tested is compared to a SOH threshold, such as 75%, step 114, and batteries with SOH below the threshold are disposed of, step 132. Batteries above the SOH threshold are sorted into quality bins based on their SOH values, step 116. The sorted batteries may be reused for various applications based on the quality bins. Some applications may require higher-quality reused batteries than other applications. For example, batteries with SOH above 95% could command a higher price and be used in more demanding applications than batteries with SOH between 80 and 75%.

FIG. 11 shows the regio-OCV test in more detail. The battery tester records the battery voltage Vcel as OCV1, step 140. The used battery to be tested is discharged using a constant current of 0.05C until a target voltage near OCV2 is reached, step 142.

This test is quick because OCV2 is very close to OCV1, such as OCV2=OCV1−0.1 volt. The battery tester could continuously test for a 0.1 volt drop, or could discharge for a short fixed period of time, such as 8 minutes.

The tester also measures the discharge current ΔQ that was supplied by the battery as its voltage dropped from OCV1 to OCV2, step 142.

The battery is allowed to cool and rest for one hour, step 144, before OCV2 is read by the battery tester. Earlier readings of OCV2 by the battery tester are not as accurate since the battery has not yet rested. The final difference between OCV1 and OCV2 may not be exactly the target drop, such as 0.1 volt, due to time effects.

After resting, OCV2 is stored in a computer memory or otherwise recorded, along with ΔQ and OCV1 that may have been recorded earlier. The values may be stored by being written into a computer memory such as a register file, SRAM, DRAM, or hard disk.

ALTERNATE EMBODIMENTS

Several other embodiments are contemplated by the inventors. For example, the region with the lowest derivative values might not be the region with the lowest OCV voltages (FIG. 6) for some battery chemistries or for battery packs with multiple battery cells. Then step 108 of FIG. 10A could compare the battery voltage Vcel to the upper and lower bounds of OCV in this lowest-derivative region, and the battery could be charged to increase Vcel until it is within this region. FIG. 10A step 110 could charge the battery for a short time when Vcel is less than the lower bound of OCV voltages for the region or could discharge the battery for a short time when Vcel is greater than the upper bound of OCV voltages for that region. The time period for charging and discharging in step 110 could be adjusted by the difference between Vcel and the nearest boundary of the target region, such as by increasing the charge time when Vcel is farther away.

The OCV region with the lowest derivate values could be selected by comparing the derivative values to a threshold, such as 0.5, to determine the upper and lower bounds of OCV for this region. There could be more than one region, or the region could have several non-contiguous parts where more comparisons are required to for the region's multiple boundaries.

In FIG. 9, initial step 121 could be deleted. Step 121 may reduce testing time by more rapidly discharging the battery with a high current. This is especially useful when the target region has the lowest OCV, since the battery is near the fully discharged state for this target region.

While FIG. 11 has described discharging the battery from OCV1 to OCV2, the battery tester could also charge the battery from OCV1 to OCV2. The polarity of values in calculation could be adjusted for charging rather than for discharging, or absolute values may be used.

The order or sequence of some steps may be changed. Storing the OCV and SOC data could occur during step 129, or could be performed over several steps 124-129, as one example. Various modifications to the neural network may be used, such as having more layers or weights or different functions. More sample points may be inputted, and more iteration cycles or epochs may be used. A very good fit for the model of calibration curve can be obtained using neural network modeling and optimization.

The calibration curve model may be implemented as a lookup table that outputs a modeled SOC value when a measured OCV is input to the lookup table. This calibration curve could also be implemented as a function performed by a processor such as a microprocessor, central processing unit, arithmetic logic unit, co-processor, or other programmed machine. Memory may be shared or separate, local, remote, or various combinations, and processors and other computational blocks may be shared, distributed, local, remote, or various combinations.

An endpoint for calibration could be based on a SOC threshold, or collection of OCV, SOC data could be halted after a certain number of datapoints are collected, or after a certain period of time has elapsed, or some other criteria. The testing technician may simply run out of time and halt further data collection and proceed to generate the model for the calibration curve. An initial model could be generated for use, and then later a more refined model from more datapoints is substituted.

While integrating current to generate $Q_{now}$ and ΔQ have been described, for constant current integrating may be multiplying the constant current by the time period that the constant current is applied. Various approximations for integrating may be applied, such as using PWL or multiplying current by time for each of several short time periods. Coulomb counting methods may be used for integrating charge over time. Integrating methods may accumulate the charge transferred over small time periods.

Although an initial deep discharge is not needed, batteries could be pre-discharged or pre-charged in additional steps if desired. Rest periods could be shortened or lengthened. A simple battery bench test setup may be used rather than complicated test benches.

The calibration curve can be approximated by one or more functions, such as a Piece-Wise-Linear (PWL) or multi-variable function. SOC could be modeled by an equation with terms such as square roots, logarithms, etc., of OCV.

The temperature of the battery during testing should be maintained at a constant value, such as room temperature. The length of a rest period after charging or discharging the battery may depend on the charge/discharge current and the thermal properties of the battery. The battery's thermal properties may change with age, such as due to increased internal resistance causing enhanced heating of older batteries.

Many parameters and values may be changed from the examples given. Voltages such as Vmax, Vmin, OCV1, OCV2, etc. and currents C may have different values, or different ratios to one another. Imin can be 0.05C, Vmax can be 4.2 volts, Vmin can be 2.75 volts, as just one of many examples. New batteries may be subjected to many charge/discharge cycles to induce aging rather than using used batteries for calibration.

The number of batteries tested for calibration could be a relatively small number such as 3 batteries when AI modeling is effective, or more batteries, such as 100 batteries, may be tested for calibration when less-effective modeling is used, or when more accurate calibration is needed. Some battery reuse applications may not require accurate SOC modeling. Ideally, the batteries tested for calibration closely match the batteries being screened, such as having the same manufacturer and model. The battery being tested can be a single battery or a battery pack, single cell or multi cells.

Some test error may be tolerated, depending on the application or intended use of the reused batteries. A test error of +/−3% of the actual SOH may be obtained in some cases. Test time may be reduced when a larger current is able to be used for a desired test accuracy or error tolerance.

Currents may be positive or negative, and terms such as charging and discharging may be used interchangeably depending on current polarity. While constant currents have been described, variable currents could also be used and integrated over time to obtain Q values.

Some embodiments may not use all components. Additional components may be added. Loss function 42 may use various error/loss and cost generators, such as a weight decay term that prevents weights from growing too large over many cycles of training optimization, a sparsity penalty that encourages nodes to zero their weights, so that only a small fraction of total nodes are used. Many substitutions, combinations, and variations are possible. Other variations and kinds of loss or cost terms can be added to loss function 42. The values of the relative scaling factors for the different cost functions can be adjusted to balance the impact of the various functions. The training endpoint for the neural network may be set for various combinations of conditions, such as a desired final accuracy, an accuracy-hardware cost product, a target hardware cost, etc.

Neural network 36, loss function 42, and other components may be implemented in a variety of technologies, using various combinations of software, hardware, firmware, routines, modules, functions, etc. The final product, the calibration curve model or a calibration function generator, may be derived from neural network 36 with the final weights, and might be implemented as a program module, or in an Application-Specific Integrated Circuit (ASIC) or other hardware to increase processing speed and lower power consumption.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A method for screening a battery for reuse or disposal comprising:

measuring an Open Circuit Voltage (OCV) of the battery as OCV1;

when OCV1 is above a first limit, discharging the battery and re-measuring the OCV of the battery as OCV1 until OCV1 is within the first limit;

discharging the battery using a constant current for a first time period;

multiplying a value of the constant current by a value of the first time period to generate a discharge current $\Delta Q$ value that is stored in a computer memory;

measuring a second OCV of the battery as OCV2 after a rest period after the battery has been discharged during the first time period;

inputting OCV1 to a calibration function processor that outputs a first modeled State of Charge (SOC1) value that corresponds to OCV1 inputted to the calibration function processor;

inputting OCV2 to the calibration function processor that outputs a second modeled State of Charge (SOC2) value that corresponds to OCV2 inputted to the calibration function processor;

generating a State of Health (SOH) value by dividing the discharge current ΔQ value by a divisor, the divisor being a charge capacity of a new battery multiplied by a difference of SOC1 and SOC2; and using the SOH value to classify the battery for reuse when the SOH value is above a SOH threshold, and to classify the battery for disposal when the SOH value is below the SOH threshold.

2. The method of claim 1 further comprising:
pre-screening the battery by measuring an initial voltage of the battery, and discarding the battery when the initial voltage of the battery is less than a minimum pre-screened voltage.

3. The method of claim 1 wherein the constant current is no more than 10% of a maximum battery current.

4. The method of claim 1 further comprising:
sorting the battery into one of multiple bins in response to the SOH value, wherein each of the multiple bins receives batteries having a different range of SOH values.

5. The method of claim 1 further comprising:
generating an OCV-SOC model that programs the calibration function processor to generate the modeled SOC values from input OCV values by:
discharging a used calibration battery to a minimum voltage;
wherein the used calibration battery is of a same type as the battery, wherein a SOH value of the used calibration battery is at least 80%;
charging the used calibration battery with a constant current and recording first datapoints as the used calibration battery is charged until a maximum voltage is reached, wherein each of the first datapoints is a (Vcharge, Q) value, wherein Vcharge is a measured voltage of the used calibration battery and Q is an integrated charge applied to the used calibration battery from the minimum voltage until Vcharge is reached;
discharging the used calibration battery with a constant current and recording second datapoints as the used calibration battery is discharged until the minimum voltage is reached, wherein each of the second datapoints is a (Vdischarge, Q) value, wherein Vdischarge is a measured voltage of the used calibration battery and Q is an integrated charge supplied by the used calibration battery from the maximum voltage until Vdischarge is reached;
recording a total integrated charge of the used calibration battery that was discharged from the maximum voltage to the minimum voltage as a current charge capacity value Qnow;
for each pair of first datapoints and second datapoints having a same Q value, averaging Vcharge and Vdischarge to obtain an averaged OCV for a datapoint;
for each datapoint, dividing Q by Qnow to obtain a State of Charge (SOC) value for the datapoint;
wherein the SOC values from the datapoints are model-input SOC values;
wherein the averaged OCV values from the datapoints are model-input OCV values;
storing in the computer memory the model-input SOC values and the model-input OCV values; and
using the model-input OCV values and the model-input SOC values to generate parameters that describe the OCV-SOC model that programs the calibration function processor to generate the modeled SOC values from input OCV values.

6. The method of claim 5 further comprising:
generating a first derivative of SOC values as a function of OCV values from the datapoints;
comparing the first derivative of the SOC values to a threshold and discarding datapoints having the first derivative of the SOC values above the threshold;
determining a target range of OCV values having the first derivative of the SOC values below the threshold;
setting the first limit at a boundary of the target range of OCV values,
wherein OCV1 and OCV2 are within the target range of OCV values.

7. The method of claim 5 wherein using the model-input OCV values and the model-input SOH values to generate parameters that describe the OCV-SOH model further comprises:
(m) inputting the model-input OCV values to inputs of a neural network;
using the neural network to process the model-input OCV values to generate a calculated SOC value;
comparing the calculated SOC value to the model-input SOC value using a loss function to generate a loss value;
using the loss value to adjust weights to nodes within the neural network and repeating from step (m) until a modeling endpoint is reached;
storing the weights in a computer memory connected to the neural network;
when the modeling endpoint is reached, using final values of the weights with the neural network to generate the modeled SOC value from the OCV input to implement the calibration function processor that generates the modeled SOC values from input OCV values.

8. The method of claim 7 wherein the neural network comprises a first layer of nodes that perform wavelet functions, and a second layer of nodes that perform product functions, and a third layer of nodes that perform summing functions.

9. A battery screening method comprising:
comparing an initial Open Circuit Voltage (OCV) of a battery to a target range of OCV voltages;
when the initial OCV is greater than the target range of OCV voltages, discharging the battery until the OCV of the battery is within the target range;
when the initial OCV is less than the target range of OCV voltages, charging the battery until the OCV of the battery is within the target range;
resting after the battery is charged or discharged;
recording a first OCV of the battery, wherein the first OCV is within the target range;
discharging the battery and measuring a ΔQ charge supplied by the battery when being discharged from the first OCV to a second OCV;
measuring the second OCV after the battery has rested from being discharged from the first OCV to the second OCV;
inputting the first OCV to a calibration function generator that returns a first modeled State of Charge (SOC) value that corresponds to a value of the first OCV inputted;
inputting the second OCV to a calibration function generator that returns a second modeled State of Charge (SOC) value that corresponds to a value of the second OCV inputted;

using the first modeled SOC value, the second modeled SOC value, and the ΔQ charge measured to calculate a modeled State of Health (SOH) value;
using the modeled SOH value to determine when the battery is to be reused and when the battery is to be reused,
whereby the battery is screened based on the modeled SOH value that is a function of the first and second OCV measured.

10. The battery screening method of claim 9 wherein the first OCV and the second OCV have a difference of no more than 0.1 volt.

11. The battery screening method of claim 9 wherein the target range of OCV voltages comprises lower OCV voltages than OCV voltages that are outside of the target range, wherein lower OCV voltages are tested.

12. The battery screening method of claim 9 further comprising:
generating a first derivative of SOC values as a function of OCV values from the datapoints;
comparing the first derivative of the SOC values to a threshold and discarding datapoints having the first derivative of the SOC values above the threshold;
determining the target range of OCV values having the first derivative of the SOC values below the threshold;
setting a first limit at a boundary of the target range of OCV values.

13. The battery screening method of claim 12 further comprising:
generating calibration datapoints by measuring a plurality of used batteries, each used battery being processed by a calibration data-collection process that comprises:
initially discharging the used battery until a lower voltage target is reached;
cooling the used battery after initial discharge for a period of rest time;
charging the used battery using a constant current until an upper voltage target is reached and recording datapoints as the used battery is charged, wherein each datapoint has a charging voltage Vcharge measured at the used battery and a cumulative charge Q as the used battery is charged when Vcharge is reached;
discharging the used battery using the constant current until the lower voltage target is reached and recording datapoints as the used battery is discharged, wherein each datapoint has a discharging voltage Vdischarge measured at the used battery and a cumulative charge Q remaining in the used battery as the used battery is discharged when Vdischarge is reached;
recording a total charge Qnow supplied by the used battery when discharged from the upper voltage target to the lower voltage target;
averaging Vcharge and Vdischarge to obtain OCV for datapoints having a same cumulative charge Q;
dividing the cumulative charge Q by Qnow to obtain SOC for datapoints to form SOC, OCV datapoints;
storing each of the SOC, OCV datapoints in a computer memory as a calibration datapoint.

14. The battery screening method of claim 13 further comprising:
using a plurality of the calibration datapoint as inputs to a model generator that programs the calibration function generator.

15. The battery screening method of claim 14 further comprising:
(a) inputting OCV values from the plurality of the calibration datapoint as inputs to an input layer of a neural network that generates a plurality of calculated outputs as a function of the inputs and a plurality of weights;
(b) comparing the plurality of calculated outputs to SOC values from the plurality of the calibration datapoint using a loss function to adjust the plurality of weights;
repeating step (a) and step (b) using adjusted values of the plurality of weights until the loss function reaches an endpoint;
applying the plurality of weights when the endpoint is reached to the neural network to generate a calculated output for a OCV input, the calculated output being the modeled SOC value of the calibration function generator.

16. A battery State of Health (SOH) estimating method comprising:
measuring an initial battery voltage of a battery;
comparing the initial battery voltage to a first voltage;
discharging the battery when the initial battery voltage is greater than the first voltage;
measuring an Open Circuit Voltage (OCV) of the battery as OCV1;
discharging the battery with a constant current over a test time period and recording a charge supplied by the battery during the test time period as ΔQ;
measuring the Open Circuit Voltage (OCV) of the battery as OCV2 after resting after the test time period;
inputting OCV1 to a processor to generate a first modeled State of Charge value SOC1;
inputting OCV2 to the processor to generate a second modeled State of Charge value SOC2;
multiplying a charge capacity of a new battery with a difference of SOC1 and SOC2 to generate a divisor, and dividing ΔQ by the divisor to generate a modeled State of Health (SOH)
comparing the modeled SOH to a SOH threshold as a basis for sorting the battery for disposal or for reuse,
whereby the battery is sorted based on the modeled SOH that is determined by two OCV voltages measured for the battery.

17. The battery State of Health (SOH) estimating method of claim 16 further comprising:
collecting datapoints from a calibration battery by measuring its charging-voltage values and SOC values during charging, and its discharging-voltage values and SOC values during discharging;
averaging the charging-voltage values and the discharging-voltage values for datapoints with a same SOC value to obtain averaged OCV values;
generating a calibration curve that best fits the datapoints;
the processor using the calibration curve to generate the modeled SOC from the OCV input to the processor.

18. The battery State of Health (SOH) estimating method of claim 17 further comprising:
inputting the datapoints to a neural network to generate the calibration curve.

19. The battery State of Health (SOH) estimating method of claim 17 further comprising:
generating a first derivative of SOC as a function of OCV, wherein SOC values and OCV values are obtained from the datapoints;
comparing the first derivative of SOC to an error threshold; and
selecting the first voltage so that OCV values below the first voltage have the first derivative of SOC that is less than the error threshold, while at least some OCV values above the first voltage have the first derivative above the error threshold.

20. The battery State of Health (SOH) estimating method of claim 17 further comprising:

initially discharging the battery with a high current that is at least ten times the constant current so that the initial battery voltage is below the first voltage.

\* \* \* \* \*